United States Patent [19]

Nishimoto et al.

[11] Patent Number: 4,784,893

[45] Date of Patent: Nov. 15, 1988

[54] HEAT CONDUCTIVE CIRCUIT BOARD AND METHOD FOR MANUFACTURING THE SAME

[75] Inventors: Yoshio Nishimoto, Kawanishi; Kiyoshi Hani, Amagasaki; Shohei Etoh, Kobe, all of Japan

[73] Assignee: Mitsubishi Denki Kabushiki Kaisha, Tokyo, Japan

[21] Appl. No.: 14,742

[22] Filed: Feb. 13, 1987

[30] Foreign Application Priority Data

Feb. 17, 1986 [JP] Japan .............................. 61-21346[U]
Feb. 17, 1986 [JP] Japan .................................. 61-32152
Feb. 25, 1986 [JP] Japan .................................. 61-39605

[51] Int. Cl.$^4$ .......................... B32B 3/00; D21D 3/00
[52] U.S. Cl. .................................. 428/209; 428/211; 428/233; 428/237; 428/265; 428/285; 428/537.5; 428/901; 162/105; 162/138; 162/157.1; 162/181.5
[58] Field of Search ............... 162/138, 105, 106, 152, 162/157.1, 181.5; 428/209, 211, 233, 237, 265, 285, 537.5, 901

[56] References Cited

U.S. PATENT DOCUMENTS

| | | | |
|---|---|---|---|
| 4,578,308 | 3/1986 | Hani et al. | 428/297 |
| 4,602,238 | 7/1986 | Furtek | 219/345 |
| 4,659,906 | 4/1987 | Furtek | 219/345 |
| 4,680,220 | 7/1987 | Johnson | 428/901 |

*Primary Examiner*—John E. Kittle
*Assistant Examiner*—P. J. Ryan
*Attorney, Agent, or Firm*—Sughrue, Mion, Zinn, Macpeak, and Seas

[57] ABSTRACT

A heat conductive circuit board includes an insulating layer provided on a metal substrate, and an electrically conductive metal foil formed on the insulating layer, and the insulating layer is formed by impregnating an alumina paper with organic polymer. The alumina paper is made by subjecting a material containing alumina fiber as the principal components to a paper-making process. The insulating layer has excellent properties of heat transfer not only in the thickness direction but also in the surface direction, and thus, the heat conductive circuit board is excellent in heat dissipation properties.

7 Claims, 3 Drawing Sheets

HEAT CONDUCTIVE CIRCUIT BOARD AND METHOD FOR MANUFACTURING THE SAME

BACKGROUND OF THE INVENTION

The present invention relates to a heat conductive circuit board for mounting various elements including semiconductor elements and resistor elements which generate a substantial amount of heat, and to a method for manufacturing such a circuit board.

With reference to FIG. 1 there is shown a known structure for a hybrid integrated circuit board. An insulating layer 6, provided on a metal substrate 3, is formed by dispersing fine particles of ceramic 5 in an organic polymer 2. The ceramic particles 5 have a high thermal conductivity and an excellent electrical insulation property. For example, alumina or boron nitride may be used as the ceramic particles. The organic polymer 2 may be formed of materials such as an epoxy resin, urethane resin and the like. The particles 5 are dispersed in the polymer 2 with a high concentration and uniformity.

In such a known circuit board the heat transfer of the organic polymer having the high concentration of heat conductive fine ceramic particles dispersed therein exhibits isotropy. Accordingly, in a hybrid integrated wiring board having a very thin (about 60 to 200 microns) insulating layer, the diffusion of heat generated by a circuit element has been heretofore controlled by the thermal conductivity in a thickness direction. For this reason, the use of highly heat conductive fine particles in an organic polymer has been a large barrier to obtaining a better hybrid integrated wiring board for diffusing heat generated by the semiconductor element or the like mounted on the wiring board.

More specifically, the insulating layer 6 is a mixture of organic polymer and ceramic. The organic polymer has strong bonding properties but a low thermal conductivity. The ceramic has excellent electrical insulation properties and a high thermal conductivity. Most of the heat generated by the circuit element is transferred to the substrate through the ceramic which has a thermal conductivity of roughly 50 to 300 times that of the organic polymer. Accordingly it is preferable to disperse the ceramic within the organic polymer so that the ceramic particles are arranged continuously as far as possible. For this purpose, the size and distribution of the constituent elements of the ceramic, and the filling rate thereof are carefully controlled. In particular, by dispersing highly heat conductive particulate ceramic and fibrous ceramic in a composite structure in the organic polymer, it is easy to obtain an insulating layer having a high filling rate as compared with the insulating layer in which only one type of ceramic is filled. A fibrous ceramic having a high thermal conductivity can be most easily obtained using alumina. When alumina fiber is made into a slurry aqueous solution with a binder dispersed therein and when the solution is subjected to a paper-making process, a sheet-type alumina paper is obtained. Then, a prepreg sheet which is a preliminary composite structure is obtained by using the alumina paper together with organic polymer containing the fine ceramic particles dispersed uniformly therein, and an insulating layer of a heat conductive circuit board is formed when the prepreg sheet is subjected to heating and compression molding while sandwiched between a conductor and a substrate. As a result in this insulating layer, the fibrous alumina the particulate alumina, and the ceramic such as boron nitride, etc., which are serving as filling materials, are dispersed uniformly both in a thickness direction (perpendicular to a planar surface) and in a surface direction (parallel to a planar surface) of the insulating layer.

In this connection, a laminated board having an alumina paper attached with a copper foil is disclosed in U.S. Pat. No. 4,578,308 (Japanese Laid-Open Patent Application No. 60-83831), and this laminated board is composed of a prepreg sheet and the copper foil affixed thereto. The prepreg sheet is formed of the alumina paper and a thermosetting resin. The alumina paper is formed by subjecting a mixture of alumina short fiber, as the principal component, and a microfibrillar organic fiber as a binding agent, to a paper making process. The alumina short fiber has a fiber diameter of roughly 100 microns or smaller and a fiber length at least about ten times greater than the fiber diameter.

The insulating layer is composed as described above. Since ceramic is dispersed uniformly in the organic polymer in a high concentration, it is difficult to provide a sufficient amount of organic polymer to insure bonding with a layer of conductive material (conductor layer). Accordingly, the conductor layer has a tendency to be deformed and adversely affected by stress load. For this reason, if a particular treatment as described, for example, in Japanese Laid-Open Patent Application No. 58-15290, is not conducted, there will be a large decrease in bonding strength, which can be represented by the peel strength defined in JIS (Japan Industry Standard), and the bonding strength will be limited to at most about 60 to 80%. Further, if an insulating layer containing ceramic bonded by using organic polymer is to be employed, the compounding ratio of the ceramic to the organic polymer must be optimized. Furthermore, on the one hand, to obtain a circuit board having a high thermal conductivity, it is necessary to use a large amount of ceramic. On the other hand, to obtain a circuit board including an insulating layer which has a high bonding strength, the content of organic polymer must be equal to or more than a predetermined amount, and the content of ceramic must be equal to or smaller than a predetermined amount. For example, a circuit board including an insulating layer in which the content of the ceramic is limited to roughly 60% or less by weight is disclosed in Japanese Utility Model Publication No. 46-25756. and 60 to 80% by weight in Japanese Laid-Open Patent Application No. 56-62388.

Further, a known method for manufacturing a circuit board of this type is illustrated in FIG. 2.

In FIG. 2, powdered ceramic is mixed with, for example, a liquid or a solution of heat-resistant resin such as epoxy resin, imide resin etc., as described in Japanese Laid-Open Patent Application No. 56-62388, and then the mixture is uniformly coated on a metal substrate. If a soluble resin is used after the resin has been coated on the metal substrate, the solvent must be removed or dried by use of hot air or a vacuum, or both. Then, a conductor is placed on the metal substrate, and the structure is subjected to heating and compression molding to thereby obtain a heat conductive circuit board. When highly heat conductive ceramic formed in a sheet is used, it is dipped in a liquid or a solution of heat-resistant resin, and a resin-impregnated sheet, for example, a prepreg sheet is produced. In this case, if the solution of the resin is used, similar to the above case, it is necessary to remove the solvent. The resin-impregnated sheet thus obtained is laminated with a metal substrate and a conductor, and a heat conductive circuit board is produced after heating and compression molding.

In the known heat conductive circuit board, on the one hand, when ceramic of the fine powder type is used in producing the insulating layer which is a composite structure of the resin and the ceramic, the mixture of the powdered ceramic and the resin must be coated on the substrate, and hence, the viscosity of the mixture is limited to a certain range. As a result, the composition of materials including the types of resins, the amount of solvent, the filling rate of the ceramic, and other parameters cannot be as freely selected as desired. On the other hand, when ceramic of the sheet-type is used, the resin must be impregnated in the ceramic sheet. The process of impregnating the resin in the ceramic sheet is inefficient for several reasons. First, the ceramic sheet is poor in strength and in flexibility. Second, as the obtained resin-impregnated ceramic sheet lacks sufficient smoothness, air bubbles are apt to remain in portions of the insulating layer which contact the metal substrate and the conductor during heating and compression molding. Third, in producing the mixture of the resin and the fine powder of ceramic, it has been necessary to mix these materials by using a roll or a vacuum mixing machine so that no air is rolled in, while adjusting the viscosity of the mixture and the filling rate of the fine powder. Fourth, a process of forming the resin-impregnated sheet, such as in a prepreg sheet, is required. In this process, to uniformly coat the resin in a fixed amount, techniques of removing excessive resin liquid and using two impregnation steps have been employed, while taking the relationship between the liquid concentration and the liquid viscosity into consideration. As described above, the formation of the insulating layer in a composite structure of the resin and the ceramic in the known method involves a problem in that since the ceramic and the resin are formed in a composite structure before laminating and compressing are performed, the productivity is low.

SUMMARY OF THE INVENTION

A first object of the present invention is to provide a hybrid integrated circuit board including an insulating layer having an excellent property of heat transfer not only in a thickness direction but also in a surface direction, so that the circuit board has an excellent heat dissipation property.

A second object of the present invention is to provide a highly heat conductive circuit board including an insulating layer which securely bonds with a conductor even when a high concentration of ceramic is contained in an organic polymer.

A third object of the present invention is to provide a method for manufacturing a heat conductive circuit board in which air bubbles are prevented from remaining in an insulating layer when resin and alumina paper are formed in a composite structure, and in which the productivity is excellent.

The first object mentioned above is achieved by a circuit board in which an insulating layer provided on at least one main surface of a metal substrate has an electrically conductive metal foil layer, and the insulating layer is formed by impregnating an alumina paper with organic binder, the alumina paper being formed by subjecting a material containing alumina fiber as a principal component thereof to a paper-making process.

The second object mentioned above is achieved by a circuit board in which an insulating layer is formed of organic polymer containing an alumina paper and highly heat conductive fine ceramic particles as filling materials to insure high heat conductivity, and the ceramic particles are dispersed with a low concentration as a portion of the insulating layer adjacent a conductor and with a high concentration at a portion of the insulating layer adjacent a substrate.

The third object mentioned above is achieved by a manufacturing method in which a resin layer is provided on a metal substrate, an alumina paper is superposed on the resin layer, a conductor is superposed on the alumina paper, and the conductor, the alumina paper, the resin layer and the metal substrate are heated and compressed to form a circuit board wherein the resin penetrates the alumina paper.

BRIEF DESCRIPTION OF THE DRAWINGS

The objects, features and advantages of the invention will be better understood with reference to the detailed description below, and the accompanying drawings, in which.

DETAILED DESCRIPTION OF THE PREFERRED EMBODIMENTS

Hereinafter, embodiments of the present invention will be described with reference to the drawings.

Figure 1:
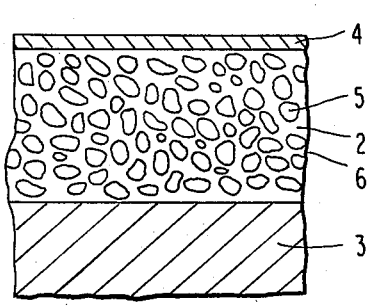
FIG. 1 is a sectional view of a known heat conductive circuit board.
Figure 3:
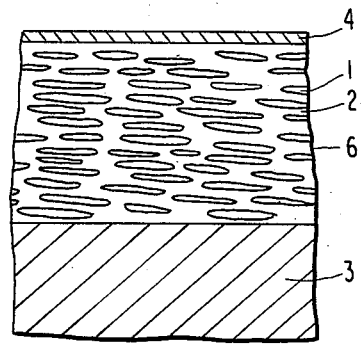
FIG. 3 is a sectional view of a heat conductive circuit board according to an embodiment of the present invention.
Figure 2:
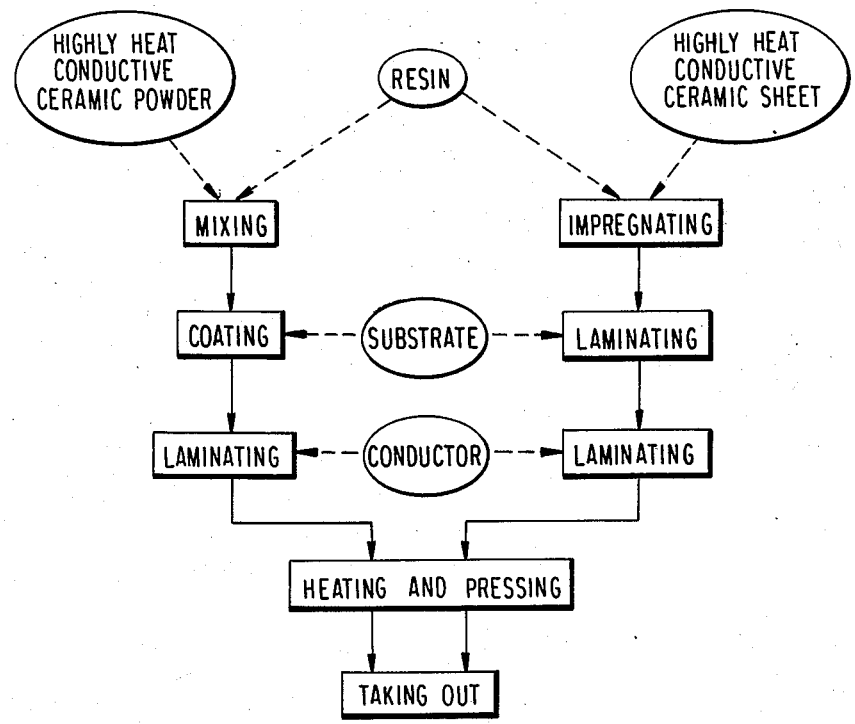
FIG. 2 is a process diagram illustrating a known manufacturing method of a heat conductive circuit board.

FIG. 3 is a sectional view of a heat conductive circuit board for a hybrid integrated wiring board of a first embodiment of the present invention. Reference numeral 1 designates alumina fiber; numeral 2 designates organic polymer; numeral 3 designates a metal substrate; numeral 4 designates a electrically conductive metal foil layer: and numeral 6 designates an insulating layer. The insulating layer 6 is formed by impregnating an alumina paper with the organic polymer 2. The alumina paper is obtained by subjecting the alumina fiber 1 to a paper-making process. Specifically, the alumina paper is formed in the following manner. First, alumina short fiber having a fiber diameter of roughly 50 microns or smaller and a fiber length of at least about 10 times the fiber diameter is fibrillated uniformly in water, and organic fiber in a microfibrillar form is added as a binding agent. The alumina and organic fiber mixture is subjected to the paper-making process. In this case, when the alumina short fiber has a diameter of 50 microns or more, the sheet-type alumina paper obtained by the paper-making process will have a thickness ranging between several millimeters to some dozen millimeters. If the fiber length is not more than about 10 times the fiber diameter, the obtained alumina paper will be excessively vulnerable to the occurrence of resin streak when the insulating layer is formed by using the alumina paper, for example, in forming a prepreg paper or a lamination. Moreover, the microfibrillar organic fiber used as the binding agent exhibits sufficient bonding power in a much smaller amount than other binding agents, for example, pulp, organic polymer, etc., and facilitates the impregnation of a resin which serves as a matrix. Accordingly, the microfibrillar organic resin is most suitable for forming the insulating layer. The resultant alumina sheet has excellent flexibility and strength even when an alumina concentration of 95% or more by weight is used.

More specifically, the prepreg paper is formed by impregnating the alumina paper with the organic polymer 2, such as an epoxy resin or imide resin. The resultant prepreg paper is sandwiched between the metal substrate 3 and the electrically conductive metal foil layer 4. For example, the metal substrate 3 can be formed of aluminum or iron, and the foil layer 4 can be formed of copper or aluminum. The metal substrate 3, prepreg paper and foil layer 4 sandwich is then heated and pressed in a laminate molding process, and thus the insulating layer 6 is formed in the hybrid integrated wiring board as shown in FIG. 3.

The filling rate of the alumina fiber 1 in the insulating layer 6 can be changed by changing the concentration of the resin solution or the conditions of laminate molding at the time when the prepreg is produced. Here, the relationship between the filling rate (%) of the alumina fiber and the peel strength (kg/cm) defined in JIS (Japan Industry Standard) C-6481 is shown in FIG. 4.

Figure 4:
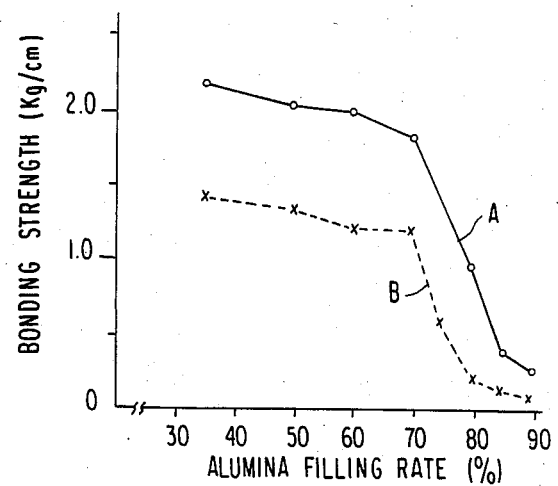
FIG. 4 is a characteristic diagram showing a correlation between filling rate (%) of alumina fiber and bonding strength (kg/cm) in an embodiment of the present invention.

In FIG. 4, the ordinate axis represents the bonding strength (kg/cm) expressed by the peel strength, and the abscissa axis represents the filling rate (%). A curve A is obtained when epoxy resin family is used as the organic polymer, and a curve B is obtained when imide resin family is used. According to these curves, it will be understood that when the filling rate of the alumina fiber reaches 70% or more by weight, the bonding (peel) strength greatly decreases.

The insulating layer of the hybrid integrated wiring board is produced by dispersing the filler having a very high thermal conductivity (about 10 to 50 Kcal/mhC°) in the organic polymer having a low thermal conductivity which is about 1/50 to 1/300 of the thermal conductivity of the filler. For this reason, the transfer of heat generated by the element mounted on the conductor is principally achieved by diffusion of the heat in the filler, and the thermal conductivity of the overall system is improved when the likelihood of contact or proximity of elements of the filler with each other is increased. That is, the thermal conductivity of the system is increased when the filling rate is improved. Accordingly, when a filler of particle type is used, since it exhibits a heat transfer mechanism having isotropy, the heat transfer in a surface direction in the hybrid integrated wiring board having a thin insulating layer (about 60 to 200 microns) seldom contributes to heat dissipation. However, for example, if a fibrous filler is used, the heat transfer in a surface direction due to heat transfer in a fiber length direction increases to a great extent, and the heat dissipation property can be improved by expanding a heat transfer area.

Figure 5A:
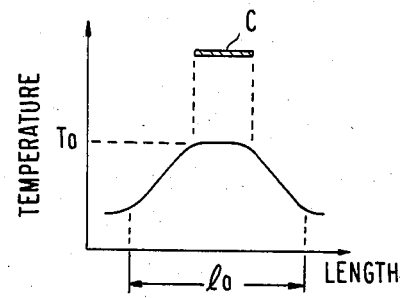
FIGS. 5A and 5B are respectively characteristic diagrams of temperature distribution in substrates of heat conductive circuit boards of an embodiment of the present invention and a known embodiment.
Figure 5B:
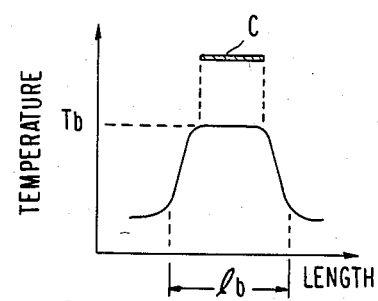

FIG. 5A is a diagram showing temperature distribution, measured by thermography, in a substrate of a hybrid integrated wiring board in an embodiment of the present invention and FIG. 5B is a diagram of temperature distribution in a substrate of a known hybrid integrated wiring board. In both insulating layers in the hybrid integrated wiring boards mentioned above, the filling rate of alumina is the same. In the Figures, letters Ta and Tb designate respectively temperatures of the substrates, la and lb designate respectively measured lengths, and C designates a mounting portion of an element of each substrate. Further, in FIGS. 5A and 5B, the ordinate represents temperature, and the abscissa represents length. According to FIGS. 5A and 5B, it is shown that the substrate having an insulating layer with fibrous alumina dispersed therein in the case of FIG. 5A has a temperature lower than a temperature (Tb>Ta) of the substrate having an insulating layer with particulate alumina dispersed therein in the case of FIG. 5B, and also a range of the substrate whose temperature is above a certain temperature in FIG. 5A is wider than that (lb<la) in FIG. 5B. And thus, in the substrate in FIG. 5A, it is shown that the heat dissipation effects are extending in the surface direction.

Hereinafter, concrete examples will be described.

EXAMPLE 1—1

A phenol cure type epoxy resin was impregnated in an alumina sheet weighing 1.05 g/dm$^2$. The impregnated alumina sheet, together with an aluminum plate (A-5052) of 2.0 mm thick, and a copper foil of 35 microns were subjected to laminate molding under conditions of 170° C. and 35 kg/cm$^2$ for 70 minutes. A laminated sheet for a metal base hybrid integrated circuit board was thus obtained. This laminated sheet had an insulating layer having an average thickness of 95 microns formed therein, and this insulating layer contained alumina short fiber (average diameter: 3 microns, average fiber length: 120 microns) of 64% by weight.

EXAMPLE 1—2

A kel imide resin was impregnated in an alumina paper weighing 1.35 g/dm$^2$. The impregnated alumina paper, together with an aluminum plate (A-5052) of 2.0 mm thick and a copper foil of 15 microns were subjected to laminate molding. A laminated sheet was obtained. This laminated sheet included an insulating layer of 115 microns thick containing alumina short fiber (average diameter: 10 microns, average fiber length: 150 microns).

COMPARATIVE EXAMPLE 1—1

Fine alumina particles (average particle diameter: 4 microns) of 65% by weight were mixed with a phenol cure type resin. After coating the mixture on an aluminum plate of 2.0 mm thick, the coated aluminum plate was subjected to laminate molding together with a copper foil of 35 microns to obtain a laminated sheet. The thickness of the laminated sheet was made to be 95 microns.

COMPARATIVE EXAMPLE 1—2

Boron nitride of 40% by weight was mixed with a kel imide resin. The mixture was subjected to laminate molding together with an aluminum plate of 2.0 mm thick and a copper foil of 15 microns so as to obtain a thickness of 115 microns for an insulating layer. A laminated sheet was thus obtained.

With regard to the four types of laminated sheets described in the above examples, thermal conductivity in a thickness direction was measured, and by mounting a power transistor thereon, a thermal resistance was measured. The results are shown in Table 1 at the end of this detailed description. As will be apparent from Table 1, the highly heat conductive insulating layer of the first embodiment of the present invention is far better in thermal resistance (shown by small values), which represents a heat transfer characteristic including heat transfer in a surface direction, (a direction substantially parallel to the main surfaces) than the insulating layer containing ceramic with the same filling rate, although the thermal conductivity representing heat transfer in the thickness direction is substantially the same.

In the first embodiment of the invention as mentioned above, although the aluminum plate was used as the substrate, and the copper foil was used as the conductor, a combination of the substrate of iron or stainless steel and the coductor of aluminum, nickel, etc., may be used. Further, as the organic polymer, in place of the thermosetting resin, a thermoplastic resin such as aromatic polyester, amide-imide or the like may be used. However, in this case, it is necessary to select suitable conditions for the molding by raising the heating temperature, slowing the pressing speed and similar adjustments so as to prevent the alumina paper from being broken due to the fluidity of the molten resin with high viscosity.

In the aforementioned embodiment, since the alumina paper is formed by subjecting the alumina fiber to the paper-making process, the alumina paper exhibits two dimensional orientation and has the following characteristics: heat transfer in the thickness direction is excellent, and heat transfer in the surface direction is also excellent. Accordingly, in the hybrid integrated wiring board having an insulating layer containing this alumina paper as a filler, the diffusion of heat generated by, for example, an element mounted on the wiring board is effected not only in the thickness direction but also in the surface direction. And hence the property of high heat dissipation which has not been obtained in the heretofore known wiring boards can be achieved.

A second embodiment of the invention will be described hereinafter. Before describing the second embodiment in detail, a general outline thereof will be described.

In a heat conductive circuit board in the second embodiment, an insulating layer has a very high filling rate in a portion near the substrate because a filler is distributed in organic polymer such that fine particles of highly heat conductive ceramic are intermingled with fiber elements of alumina fiber in the portion near the substrate. In contrast to this, in a portion in the insulating layer near the conductor, the organic polymer contains mainly only an alumina paper and virtually no ceramic particles. However, in the alumina paper used in this case, if the alumina fiber has a diameter of roughly 50 microns or larger, the thickness of a paper obtained by the paper-making process will range between several millimeters to some dozen millimeters. Therefore, it is inconvenient to form an insulating layer of a required thickness (about 60 to 1000 microns). Accordingly, it is not preferable to use alumina fibers with these dimensions. Also, if the fiber length is not more than 10 times the fiber diameter, it will be difficult to obtain an alumina paper having a strength sufficient to withstand the occurrence of resin streak which is caused in forming the insulating layer. For example, resin streak can occur in forming a prepreg, or in a heating and compression molding process, and it is not desirable. Further, the microfibrillar organic fiber used as the binding agent requires a far smaller amount to obtain a sufficient binding condition as compared with other binding agents, for example, pulp or organic polymer. Accordingly, the microfibrillar organic fiber is indispensable in this embodiment in order to facilitate the impregnation of the organic polymer which constitutes a matrix in the insulating layer.

Hereinafter, the second embodiment of the present invention will be described with reference to the drawings. Organic polymer suitable for forming an insulating layer is mixed with fine particles of ceramic, for example, alumina boron nitride or the like. It is preferable that the particle diameter be roughly 30 microns or smaller which is equivalent to a maximum distance between alumina fiber elements of an alumina paper. After this mixture is coated on a plate of iron or aluminum which serves as the substrate, alumina paper is superposed on the coated plate, and a foil of copper or aluminum which serves as the conductor is superposed on the alumina paper followed by heating and compression molding to obtain a laminated sheet for a highly heat conductive circuit board. The content ($c_a$) of the filler at a position (between $t_a$ and $t_b$) in an arbitrary thickness direction of the laminated sheet is obtained in the following manner. After shaving off an appropriate amount of thickness from the substrate side, a first remaining portion of thickness is heated at 800° C. for 30 minutes, and the content ($c_a$) of the filler is obtained from the residue at this time by using a thermogravimetric analyzer. In a similar way, a different amount is shaved off, and a content ($c_b$) of the filler in a second remaining portion of thickness $t_b$ is obtained. By using these measurements, $C\delta$ can be obtained from the following formula:

$$C\delta = \frac{\dfrac{W_a \times \dfrac{c_a}{100} - W_b \times \dfrac{c_b}{100}}{(t_a - t_b)}}{\dfrac{W_a - W_b}{(t_a - t_b)}} \times 100 = \frac{W_a \times c_a - W_b \times c_b}{W_a - W_b}$$

where, $W_a$ is a weight per unit area of the portion having the thickness of $t_a$, and $W_b$ is a weight per unit area of the portion having the thickness of $t_b$.

By obtaining this $C\delta$ for each position (each layer) in the thickness direction, a concentration distribution of the filler can be obtained. According to the results obtained by using the aforementioned process and accompanying formula, in the insulating layer of the circuit board, the concentration of the filler was distributed such that the concentration was high at a portion of the insulating layer near the substrate and it was low at a portion of the insulating layer near the conductor.

Examples of the second embodiment of the present invention will be described.

EXAMPLE 2—1

Figure 6:
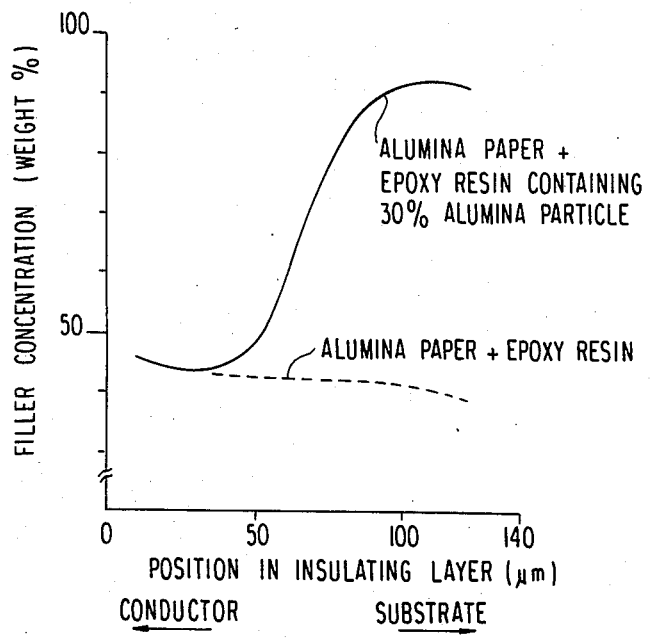
FIG. 6 is a graph showing filler concentration at each position in the thickness direction in an insulating layer of a highly heat conductive circuit board of another embodiment of the present invention.
Figure 7:
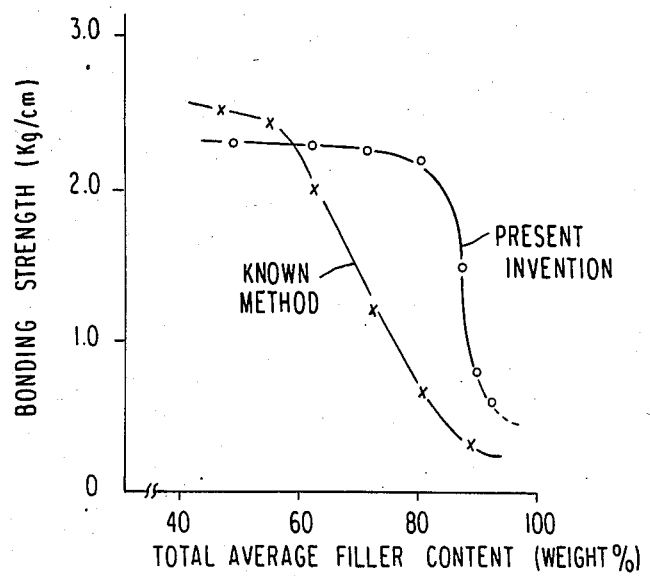
FIG. 7 is a graph showing a relationship between filler concentration and bonding strength.

Mixtures were obtained by mixing a bisphenol A liquid epoxy resin of organic polymer with fine alumina particles (having diameters of 2 to 8 microns, with an average of 4 microns) of highly heat conductive ceramic whose filling rate was varied in a range of 0 to 70% by weight. Each of the mixtures were coated uniformly on an aluminum plate of 2.0 mm thick to reach a thickness of 140 microns. An alumina paper weighing 1.05 g/dm$^2$ and a copper foil of 35 microns thick were superposed on the coated aluminum plate, followed by heating and compression molding under conditions of 30 kg/cm$^2$ and 160° C. for 60 minutes to form a laminated sheet. For each of the laminated sheets obtained as described above, a peel strength defined in JIS C-6481 was measured, and the results are shown in FIG. 7. Further, the filler concentration distribution in the thickness direction in an insulating layer of each of two laminated sheets is shown in FIG. 6, in which one laminated sheet was formed by using the epoxy resin containing 0% by weight of fine alumina particles and the other laminated sheet was formed by using the epoxy resin containing 30% by weight of fine alumina particles. In addition, the dielectric strength defined in JIS C-6481 and the thermal conductivity of an insulating layer having a total average filler content of 81% by weight are shown in Table 2 at the end of this detailed description.

EXAMPLE 2—2

Boron nitride (5 to 15 microns in particle diameter, with an average of 12 microns), in an amount corresponding to a solid content of 20% by weight, was mixed with a methyl ethyl keton solution of a phenol cure type epoxy resin used as an organic polymer. The mixture was coated on an aluminum plate of 2.0 mm thick to a thickness of 180 microns, followed by drying in a vacuum of 10 to 50 Torr at 80° C. for 5 to 20 minutes. An alumina paper weighing 0.80 g/dm$^2$ and copper foil of 35 microns thick were superposed on the coated aluminum plate, followed by heating and compression molding under 40 kg/cm$^2$ and at 170° C. for 60 minutes to obtain a laminated sheet. The total average filler content, peel strength, dielectric strength, and thermal conductivity of the sheet were measured, and the results are shown in Table 2.

COMPARATIVE EXAMPLE 2—1

Each of the mixtures of bisphenol A liquid epoxy resin and fine alumina particles used in the above-mentioned Example 2—1 were added with methyl ethyl keton to produce a resin solution having a liquid viscosity regulated to about 1200 cp. After dipping an alumina paper weighing 1.05 g/dm$^2$ into the resin solution, the methyl ethyl keton was removed from the alumina paper in a vacuum of 10 to 50 Torr to produce a resin-impregnated sheet. The resin-impregnated sheet was laminated with an aluminum plate of 2.0 mm thick and a copper foil of 35 microns, followed by heating and compression molding under the same conditions as in Example 2—1 to obtain a laminated sheet. For each laminated sheet produced as described above, total average filler content and peel strength were measured and a relationship between the total average filler content and the peel strength is shown in FIG. 7. Further, for the laminated sheet having a total average filler content of 81% by weight, the dielectric strength and the thermal conductivity were measured, and the results are shown in Table 2.

COMPARATIVE EXAMPLE 2—2

By using the same materials as in Example 2—2, an alumina paper-epoxy resin prepreg sheet was formed, and the prepreg sheet was laminated together with an aluminum plate of 2.0 mm thick and a copper foil of 35 microns, followed by heating and compression molding under the same conditions as in Example 2—1 to obtain a laminated sheet. Total average filler content peel strength, dielectric strength and thermal conductivity of the resultant insulating layer were measured. The results are shown in Table 2.

In producing each of the laminated sheets mentioned above, when the insulating layer is formed by using a sheet-type material (for example, a prepreg sheet) in which a mixture of organic polymer and fine ceramic particles is impregnated in an alumina paper to form a composite structure prior to superposing and lamination, so that at the time of heating and compression molding, air remaining in the interfaces between the substrate and the insulating layer and between the conductor and the insulating layer cannot be easily expunged from the substrate. insulating layer and conductor layered structure when the organic polymer adheres to the substrate and to the conductor due to melting of the organic polymer. Thus, the air remains inside. The insulating layer will contain air bubbles caused by the remaining air and will have its dielectric strength degraded. In contrast to this, in the present invention, when the mixture of the organic polymer and the ceramic coated on the substrate is heated and compressed, the organic polymer having satisfactory fluidity penetrates and is absorbed into the alumina paper located between the foil and the aluminum plate and all interstices therein, and thus, it is easy to discharge the gases such as air or the like remaining within the layered structure. For this reason, the resultant insulating layer scarcely contains any air bubbles, and exhibits an excellent dielectric strength as can be seen from Table 2.

Further, as can be appreciated from the filler concentration distribution shown in FIG. 6, the insulating layer is a composite structure of the organic polymer and the alumina paper, and in the organic polymer, a greater amount of fine particles of the ceramic remain at the portion of the insulating layer adjacent the substrate, and in the portion of the insulating layer near the conductor, the organic polymer, having wetting characteristics and adhesion properties, exists in a greater amount. Hence, as shown in Table 2, an insulating layer of excellent adhesion properties can be obtained. Accordingly, as can be seen from a comparison of Example 2-1 and Comparative Example 2-1, even when the content of the ceramic, such as alumina or boron nitride, is increased in the insulating layer, the adhesion properties of the insulating layer with respect to the conductor are excellent. In accordance with the present invention, degradation of the bonding strength can be prevented by adjusting the concentration distribution of the ceramic such that much of the organic polymer exists in the portion of the insulating layer in contact with the conductor.

Further, in this embodiment, although epoxy resin was used as the organic polymer, not only other thermosetting resins such as maleimide resin and the like but also thermoplastic resins such as aromatic polyester, polyamide-imide and the like may be used to obtain similar effects as in the aforementioned embodiment. However, when the thermoplastic resins are used, since most of them are generally of high viscosity. it is necessary to prevent paper cutting of the alumina paper due to a fluid resistance of the resin by gradually pressing while applying a sufficiently high temperature which does not cause decomposition.

Hereinafter, a third embodiment of the invention will be described. Before describing the third embodiment in detail, an outline of the embodiment will be described.

In the production of an insulating layer by forming a composite structure of a resin and an alumina paper in the embodiment, since the resin coated on a metal substrate is in a liquid condition during a heating and compression molding process, when the pressure is applied the resin is easily absorbed by the alumina paper to form the composite structure. At this time, gases such as air remaining between fibers of the alumina paper are discharged from one surface of the alumina paper due to intrusion of the resin which is absorbed from the other surface. For this reason, as compared with the case in which the resin-impregnated paper is subjected to heating and compression molding, it is possible to prevent air bubbles from remaining in the insulating layer.

Figure 8:
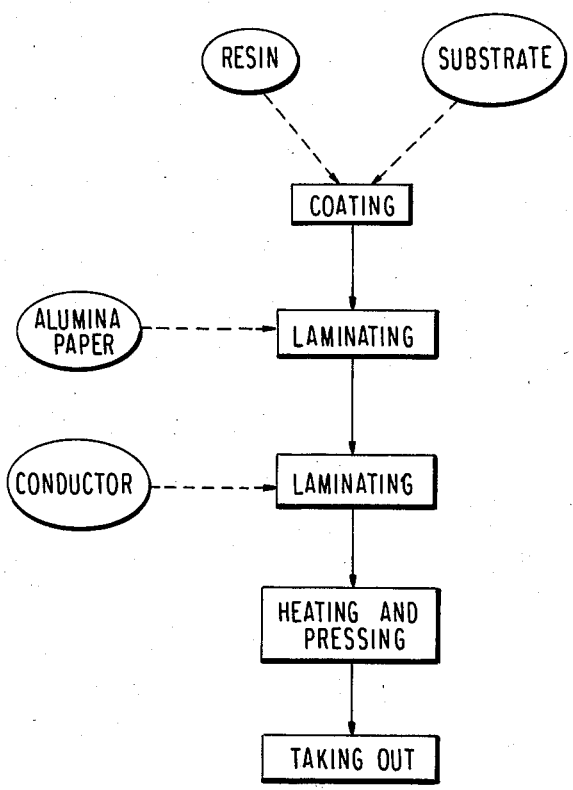
FIG. 8 is a process diagram illustrating a method of manufacturing a heat conductive circuit board according to an embodiment of the present invention.

Hereinafter, a method for manufacturing a heat conductive wiring board in accordance with the present invention will be described with reference to FIG. 8. First, a liquid or a solution of heat-resistant resin is coated on a metal substrate such as an aluminum plate or an iron plate. The coating is carried out by roller, brush, or spray coating, or by a silk screen printing technique. The amount of heat-resistant resin to be coated may be determined by an apparent density (weighing) of the alumina sheet and a desired filling rate of alumina. There is no need to coat two times or to adjust the amount of drip which is caused after the sheet has been impregnated depending on a liquid viscosity and a resin viscosity as in the case of producing a pre-preg sheet. In this case. when the solution of resin is used. a solvent contained in the resin is removed (dried) under a predetermined condition. An alumina sheet weighing a predetermined amount and a conductor are placed on the metal substrate coated with the resin as described above, followed by heating and compression molding under predetermined conditions. The insulating layer is thus formed and the heat conductive wiring board is obtained. The resin coated on the metal plate is in a liquid condition at the time of heating and compression molding. The alumina paper superposed on the metal substrate is produced by subjecting alumina fiber to a paper-making process, and it has a structure in which liquid is easily absorbed. Accordingly the alumina paper superposed on the resin at the time of pressing absorbs the resin without any difficulty. At this time, the resin which has penetrated into the alumina paper from the substrate side does not trap air between fiber elements of the alumina fiber. Instead, any air existing between fiber elements is discharged from the substrate side to the outside of the insulating layer. Consequently, very few air bubbles remain in the insulating layer. In this case, the alumina short fiber used here to constitute the alumina paper preferably has a diameter of about 50 microns or smaller. When the diameter is larger than 50 microns, the thickness of a paper produced by the paper-making process will be in a range from several millimeters to some dozen millimeters, and this thickness exceeds a required thickness of the insulating layer. The fiber length is preferably at least 10 times the fiber diameter. When the fiber length is smaller than 10 times the fiber diameter, the alumina paper will be weak against resin streak. Further it is preferable to use a microfibrillar organic resin as a binding agent, because such a resin exhibits sufficient bonding power with a far smaller amount as compared with other binding agents such as pulp and organic polymer, and it facilitates impregnation of the resin, which serves as a matrix. Accordingly, the microfibrillar organic resin is well suited for producing the insulating layer by forming a composite structure of the resin and the alumina paper.

Hereinafter. the third embodiment will be described concretely by way of concrete examples.

EXAMPLE 3-1

As the resin, a methyl ethyl keton (MEK) solution of phenol cure type epoxy resin of 60% was used. After coating this solution on an aluminum plate of 2.0 mm thick to a thickness of 2.3 g/dm$^2$ the aluminum plate was left to stand and dried at 120° C. for 5 to 15 minutes. After superposing an alumina paper having a density of 1.05 g/dm$^2$ and a copper foil of 35 microns on the dried aluminum plate, the superposed structure was subjected to heating and compression molding under the heating and pressing conditions of 165° C. and 35 kg/cm$^2$ for 60 minutes. The characteristics of the resultant heat conductive wiring board are shown in Table 3 which is set forth at the end of this detailed description.

EXAMPLE 3-2

A 35% N-methyl-pyrrolidone solution of kel imide resin (a product of Nippon Polyimide Co.. for example) was coated on an aluminum plate of 2.0 mm thick to a thickness of 5.5 g/dm$^2$, and then an alumina paper weighing 1.30 g/dm$^2$ and a copper foil of 35 microns were superposed on the aluminum plate, followed by heating and press molding under the heating and pressing conditions of 190° C. and 50 kg/cm$^2$ for 90 minutes. The characteristics of the wiring board thus obtained are shown in Table 3.

COMPARATIVE EXAMPLE 3-1

A prepreg sheet was obtained by using the same materials as in Example 3-1 and under the same conditions and the same drying conditions as in Example 3-1. This prepreg sheet was molded together with the same aluminum plate and copper foil under the same conditions as in Example 3-1, and a heat conductive wiring board was obtained. The characteristics of the wiring board are shown in Table 3.

COMPARATIVE EXAMPLE 3-2

A prepreg sheet was obtained by using the same materials as in Example 3-2 and under the same conditions and the same drying conditions as in Example 3-2. This prepreg sheet was molded together with the same aluminum plate and copper foil under the same conditions as in Example 3-2. and a heat conductive wiring board was obtained. The characteristics of the wiring board are shown in Table 3.

COMPARATIVE EXAMPLE 3—3

The alumina short fiber used in the alumina paper in Example 3-1 was added to the same resin solution as in Example 3-1 and mixed until a uniform mixture was obtained The mixture was coated on the same substrate as in Example 3-1, and dried under the same conditions as in Example 3-1, followed by laminate molding together with a copper foil to obtain a heat conductive wiring board. The characteristics of the wiring board are shown in Table 3.

COMPARATIVE EXAMPLE 3-4

The alumina short fiber used in the alumina paper in Example 3-2 was added to the same resin solution as in Example 3-2 and mixed until a uniform mixture was obtained. The mixture was coated on the same substrate as in Example 3-2, and dried under the same conditions as in Example 3-2, followed by laminate molding together with a copper foil to obtain a heat conductive wiring board. The characteristics of the wiring board are shown in Table 3, where, void content: the amount of bubbles contained per unit volume, and represented by measured density/theoretical density.

dielectric strength: defined in JIS (Japan Industry Standard).6481, and production time ratio: the ratio of production time in the particular Comparative Example to the production time in the corresponding Example for the same resin family.

As is apparent from Table 3, in the method of this embodiment as compared with known methods. the occurrence of rolling of the air bubbles in the insulating layer is minimal and further. the heat conductive wiring board can be easily produced.

Further, in the aforementioned embodiment, although aluminum plate is used as the substrate, an iron plate or a stainless steel plate may be used. and as the conductor, an aluminum foil or a nickel foil may be used in place of the copper foil to achieve substantially the same results. Also, instead of the thermosetting resins such as polyimide and esteramide resin, thermoplastic resins such as aromatic polyester and polyamide-imide may be used. Further, in performing heating and compression molding, molding in a vacuum is effective in obtaining a heat conductive wiring board having a superior insulating layer.

As described in the foregoing, in the method of the present invention, a resin layer is formed on a metal substrate, an alumina paper is superposed on the resin layer, a conductor is superposed on the alumina paper and by heating and compressing, a heat conductive wiring board is produced. In this case, since the resin is absorbed in the alumina paper in the process of forming an insulating layer, the insulating layer having a composite structure of the resin and the alumina paper does not contain air bubbles. and it is possible to select the materials as desired and the productivity is excellent.

Further, in each of the first second and third embodiments the mixing rate of the alumina fiber in the insulating layer is preferably from 30 to 70% by weight. and if the mixing rate is 30% or smaller by weight, the thermal conductivity will be decreased still more, and it is not preferred.

Further, in the first, second and third embodiments, the electrically conductive metal foil layer can be etched according to a required pattern, and consequently, wiring is formed on the circuit board.

TABLE 1

|  | UNITS | EXAMPLE 1-1 | EXAMPLE 1-2 | COMPARATIVE EXAMPLE 1-1 | COMPARATIVE EXAMPLE 1-2 |
|---|---|---|---|---|---|
| FILLER | — | ALUMINA PAPER | ALUMINA PAPER | ALUMINA FINE POWDER | BORON NITRIDE |
| FILLING RATE | WEIGHT % | 64 | 42 | 65 | 40 |
| THICKNESS OF COPPER FOIL | $\mu$m | 35 | 15 | 35 | 15 |
| THERMAL CONDUCTIVITY | Kcal/mhC.° | 78 | 44 | 72 | 41 |
| THERMAL RESISTANCE | °C./W | 0.30 | 0.50 | 0.55 | 0.85 |

TABLE 2

|  | UNITS | EXAMPLE 2-1 | EXAMPLE 2-2 | COMPARATIVE EXAMPLE 2-1 | COMPARATIVE EXAMPLE 2-2 |
|---|---|---|---|---|---|
| NAME OF RESIN |  | BISPHENOL A EPOXY | PHENOL CURE TYPE EPOXY | BISPHENOL A EPOXY | PHENOL CURE TYPE EPOXY |
| THICKNESS OF INSULATIVE LAYER | $\mu$m | 140 | 90 | 135 | 90 |
| TOTAL MEAN FILLER CONTENT | WEIGHT % | 81 | 69 | 81 | 67 |
| BONDING STRENGTH | Kg/cm | 2.2 | 2.3 | 0.7 | 0.5 |
| DIELECTRIC STRENGTH | K$v$ | 8.9 | 7.2 | 3.9 | 4.1 |
| THERMAL CONDUCTIVITY | kcal/mhC.° | 95 | 106 | 92 | 98 |

TABLE 3

| ITEM | UNIT | EXAMPLE 3-1 | EXAMPLE 3-2 | COMPARATIVE EXAMPLE 3-1 | COMPARATIVE EXAMPLE 3-2 | COMPARATIVE EXAMPLE 3-3 | COMPARATIVE EXAMPLE 3-4 |
|---|---|---|---|---|---|---|---|
| RESIN | — | EPOXY | KEL IMIDE | EPOXY | KEL IMIDE | EPOXY | KEL IMIDE |
| ALUMINA CONTENT | % | 52 | 43 | 53 | 41 | 50 | 39 |
| VOID CONTENT | % | 0 | 0 | 0.9 | 1.4 | 0.1 | 0.2 |
| THERMAL CONDUCITIVITY | Kcal/mh°C. | 78 | 63 | 71 | 58 | 72 | 60 |

TABLE 3-continued

| ITEM | UNIT | EXAMPLE 3-1 | EXAMPLE 3-2 | COMPARATIVE EXAMPLE 3-1 | COMPARATIVE EXAMPLE 3-2 | COMPARATIVE EXAMPLE 3-3 | COMPARATIVE EXAMPLE 3-4 |
| --- | --- | --- | --- | --- | --- | --- | --- |
| DIELECTRIC STRENGTH | KV | 7.7 | 8.9 | 4.1 | 4.8 | 6.4 | 7.5 |
| PRODUCTION TIME RATIO | — | 1.0 | 1.0 | 1.4 to 1.6 | 1.5 to 1.7 | 1.6 to 1.8 | 1.8 to 2.0 |

We claim:

1. A heat conductive circuit board comprising:
   (a) a metal substrate (3):
   (b) an insulating layer (6) provided on at least one main surface of said metal substrate, said insulating layer being formed by impregnating an alumina paper with an organic polymer and a microfibrillar organic fiber as a bonding agent, said alumina paper being obtained by subjecting a material containing alumina fiber having a fiber diameter of a maximum of 50 microns and a fiber length which is at least ten times greater thant the fiber diameter as a principal component thereof in an amount in a range from 30 to 70% by weight to a paper-making process; and
   (c) an electrically conductive metal foil layer (4) provided on said insulating layer.

2. A heat conductive circuit board according to claim 1, wherein said insulating layer has a concentration gradient of heat conductive fine ceramic particles in which the concentration of said ceramic particles in the organic polymer is high in a portion of said insulating layer proximate to said metal substrate and is low in a portion of said insulating layer proximate to said electrically conductive metal foil layer.

3. A method for manufactureing a heat conductive circuit board comprising the steps of:
   (a) providing a resin layer on a metal substrate;
   (b) superposing an alumina paper on said resin layer, wherein said alumina paper is made by subjecting alumina fiber to a paper-making process by using a microfibrillar fiber as binding agent, and wherein said alumina paper contains as a principal component alumina fiber having a fiber diameter of a maximum of approximately 50 microns and a fiber length which is at least ten times greater than the fiber diameter;
   (c) superposing a conductor on said alumina paper; and
   (d) molding said metal substrate, said resin layer, said alumina paper, and said conductor together by heating and compressing to produce said heat conductive circuit board in which said resin is absorbed into said alumina paper, wherein air bubbles are removed from said alumina paper is said molding step.

4. A method according to claim 3, wherein an insulating layer is formed between said conductor and said substrate and wherein said insulating layer has a concentration gradient of heat conductive fine ceramic particles such that a concentration of said particles decreases in a direction from said substrate toward said conductor.

5. A heat conductive circuit board according to claim 1, wherein said conductor is a metal selected from the group consisting of aluminum, nickel and copper.

6. A heat conductive circuit board according to claim 1, wherein said substrate is a metal selected from the group consisting of aluminum, iron, and stainless steel.

7. A heat conductive circuit board according to claim 2, wherein said ceramic particles comprise material selected from the group consisting of alumina and boron nitride.

* * * * *